United States Patent
Jahl et al.

(10) Patent No.: US 6,946,158 B2
(45) Date of Patent: Sep. 20, 2005

(54) DEPOSITION OF TITANIUM AMIDES

(75) Inventors: Matthias J. Jahl, Poway, CA (US); Douglas W. Carson, Berkeley, CA (US); Shantia Riahi, Vista, CA (US); Raymond Nicholas Vrtis, Allentown, PA (US)

(73) Assignee: Air Products and Chemicals, Inc., Allentown, PA (US)

(*) Notice: Subject to any disclaimer, the term of this patent is extended or adjusted under 35 U.S.C. 154(b) by 176 days.

(21) Appl. No.: 10/167,084

(22) Filed: Jun. 10, 2002

(65) Prior Publication Data

US 2003/0072883 A1 Apr. 17, 2003

Related U.S. Application Data

(62) Division of application No. 09/676,426, filed on Sep. 29, 2000, now Pat. No. 6,602,783.
(60) Provisional application No. 60/157,866, filed on Oct. 6, 1999.

(51) Int. Cl.$^7$ ............................................. C23C 16/34
(52) U.S. Cl. .............. 427/8; 427/255.391; 427/255.394
(58) Field of Search ............................. 427/8, 255.391, 427/255.394

(56) References Cited

U.S. PATENT DOCUMENTS

| | | | |
|---|---|---|---|
| 5,139,825 A | | 8/1992 | Gordon et al. ............ 427/255.2 |
| 5,194,642 A | | 3/1993 | Winter et al. |
| 5,691,206 A | * | 11/1997 | Pawliszyn ................... 436/178 |
| 5,704,214 A | | 1/1998 | Fujikawa et al. |
| 5,763,007 A | * | 6/1998 | Weiller ..................... 427/248.1 |
| 5,866,205 A | | 2/1999 | Vaartstra et al. ......... 427/255.1 |
| 5,900,279 A | | 5/1999 | Hideaki et al. |
| 5,919,522 A | | 7/1999 | Baum et al. |

OTHER PUBLICATIONS

Pierson, "Handbook of Chemical Vapor Deposition," Noyes Publications, (1992), pp. 87–88.

* cited by examiner

*Primary Examiner*—Timothy Meeks
(74) *Attorney, Agent, or Firm*—Rosaleen P. Morris-Oskanian

(57) ABSTRACT

The present invention is a process for enhancing the chemical vapor deposition of titanium nitride from a titanium containing precursor selected from the group consisting of tetrakis(dimethylamino)titanium, tetrakis(diethylamino)titanium and mixtures thereof, reacted with ammonia to produce the titanium nitride on a semiconductor substrate by the addition of organic amines, such as dipropylamine, in a range of approximately 10 parts per million by weight to 10% by weight, preferably 50 parts per million by weight to 1.0 percent by weight, most preferably 100 parts per million by weight to 5000 parts per million by weight to the titanium containing precursor wherein prior to the reaction, said titanium containing precursor is subjected to a purification process to remove hydrocarbon impurities from the titanium containing precursor. It is shown that addition of small amounts of organic amines enhance the deposition rate of titanium nitride, while the presence of hydrocarbons, such as n-decane, retard the deposition rate of titanium nitride.

9 Claims, 5 Drawing Sheets

DEPOSITION OF TITANIUM AMIDES

CROSS-REFERENCE TO RELATED APPLICATIONS

This application is a divisional application of U.S. application Ser. No. 09/676,426 filed 29 Sep. 2000, now U.S. Pat. No. 6,602,783 which claims benefit of U.S. Provisional Patent Application No. 60/157,866 filed 6 Oct. 1999.

STATEMENT REGARDING FEDERALLY SPONSORED RESEARCH OR DEVELOPMENT

Not applicable.

BACKGROUND OF THE INVENTION

Titanium compounds, such as titanium nitride are finding increasing usage in a number of utilities, particularly in the production of electronic materials of construction for integrated circuits for computer chips.

Titanium nitride provides enhanced electrical conductivity for electronic circuits and exhibits excellent barrier properties for other metal depositions on silicon substrates. As a result, the electronics device fabrication industry has found increasing usage of titanium compound depositions for coatings prior to subsequent conductor metal depositions.

Techniques for titanium nitride deposition from tetrakis(dimethylamino)titanium (TDMAT) and tetrakis(diethylamino)titanium (TDEAT) are known in the literature. For instance, U.S. Pat. No. 5,139,825 discloses the deposition of titanium nitride from TDMAT or TDEAT in reaction with ammonia under chemical vapor deposition (CVD) conditions of 100 to 400° C., preferably 150 to 300° C., most preferably 200 to 250° C., under reduced pressure and using an inert carrier gas, such as nitrogen or helium, to deposit titanium nitride on a heated substrate, such as a heated silicon containing substrate.

However, the deposition rate of titanium nitride has been highly variable and does not lend itself to repeatable, precise use in the electronic fabrication industry, where a multitude of silicon wafers are processed simultaneously, and many batches of wafers are processed consecutively. High yields of electronically acceptable wafers are necessary for the titanium nitride process to be acceptable commercially to the electronics fabrication industry. Additionally, the speed of deposition is critical to provide economic processing of titanium nitride coated wafers in the hundred plus step processing of blank silicon wafers to the final electrically acceptable individual integrated circuits produced by the electronics fabrication industry.

The problems of low depostion rate and variable deposition rate for titanium compounds deposited by CVD from titanium containing precursors is unexpectedly overcome by the process of the present invention by the addtion of amine additives and/or the removal of trace amounts of hydrocarbon impurities as will be set forth with greater detail below.

BRIEF SUMMARY OF THE INVENTION

The present invention is a process for enhancing the chemical vapor deposition of titanium nitride from a titanium containing precursor selected from the group consisting of tetrakis(dimethylamino)titanium, tetrakis(diethylamino)titanium and mixtures thereof, reacted with ammonia to produce the titanium nitride on a semiconductor substrate by the addition of organic amines, such as dipropylamine, in a range of approximately 10 parts per million by weight to 10 percent by weight, preferably 50 parts per million by weight to 1.0 percent by weight, most preferably 100 parts per million by weight to 5000 parts per million by weight to the titanium containing precursor wherein prior to the reaction, said titanium containing precursor is subjected to a purification process to remove hydrocarbon impurities from the titanium containing precursor. It is shown that addition of small amounts of organic amines enhance the deposition rate of titanium nitride, while the presence of hydrocarbons, such as n-decane and analogous hydrocarbons, retard the deposition rate of titanium nitride.

The Present Invention is also a process for determining a predicted deposition rate of a batch of a titanium containing precursor in a chemical vapor deposition of a titanium containing compound on a substrate, comprising; analyzing the organic amine content of the batch to determine an analytical amine content, comparing the analytical amine content against an amine content standard and determining the predicted deposition rate from a deposition rate standard based upon the deviation of the analytical amine content from the amine content standard, wherein the predicted deposition rate is greater than the deposition rate standard when the analytical amine content is greater than the amine content standard and the predicted deposition rate is less than the deposition rate standard when the analytical amine content is less than the amine content standard.

The Present Invention is further a process for determining a predicted deposition rate of a batch of a titanium containing precursor in a chemical vapor deposition of a titanium containing compound on a substrate, comprising; analyzing the hydrocarbon content of the batch to determine an analytical hydrocarbon content, comparing the analytical hydrocarbon content against an hydrocarbon content standard and determining the predicted deposition rate from a deposition rate standard based upon a deviation of the analytical hydrocarbon content from the hydrocarbon content standard, wherein the predicted deposition rate is less than the deposition rate standard when the analytical hydrocarbon content is greater than the hydrocarbon content standard and the predicted deposition rate is greater than the deposition rate standard when the analytical hydrocarbon content is less than the hydrocarbon content standard.

GC Conditions: Injector Temperature: 190° C.; Oven Program: 40° C. for 2 minutes, Ramp at 25° C./minute, 250° C. for 2 minutes; Detector: thermal conductivity, temperature= 250° C.; Column: DB-1, 30 m long×0.53 mm ID×5 μm film.

Figure 4:
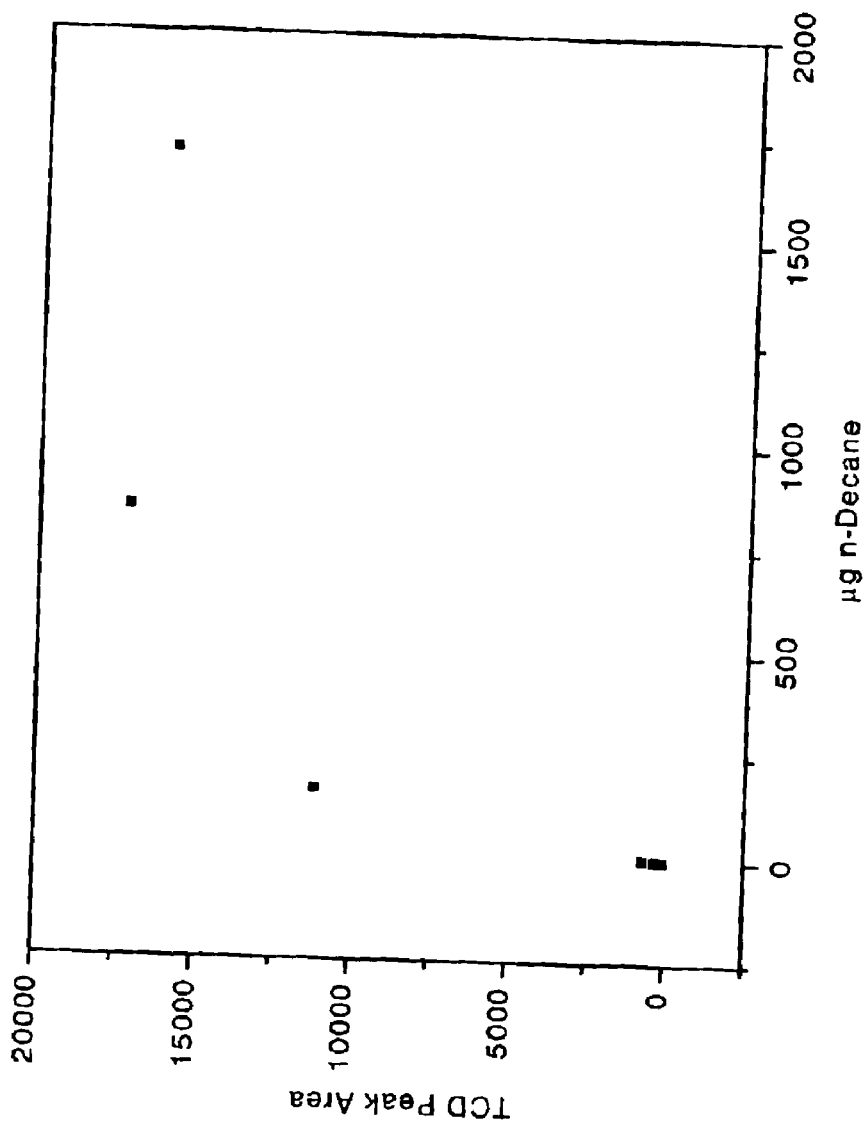

FIG. 4 is a graph of the variation of peak area with μg decane added. Conditions: 5 mL aqueous volume, 10 mL headspace, 100 μm PDMS fiber, 2 minute absorb, 1 min desorb, thermal conductivity detector. 6 data points cover range of 0.4 to 1720 μg n-decane.

Figure 5:
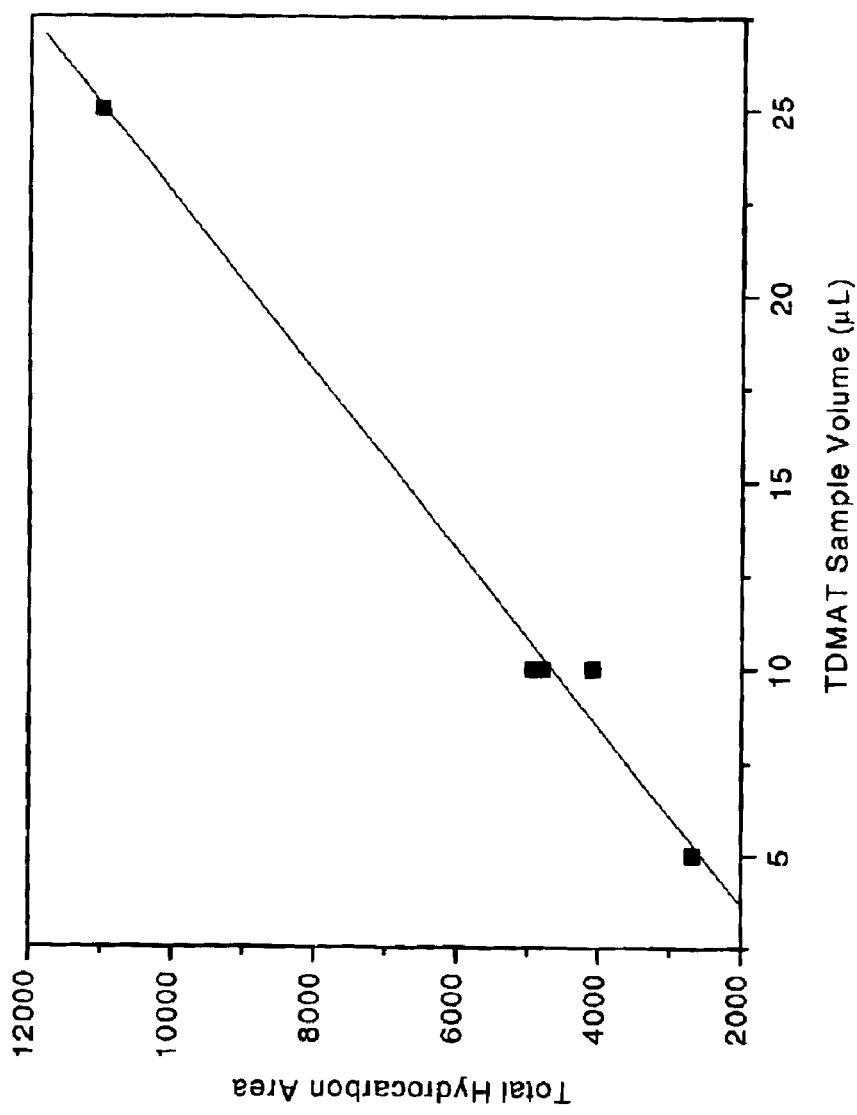

FIG. 5 is a graph of the total hydrocarbon peak area as a function of sample volume (1 μL=1000 μg). Conditions: 5 mL aqueous volume, 10 mL headspace, 100 μm PDMS fiber, 2 minute absorb, 1 min desorb, thermal conductivity detector.

DETAILED DESCRIPTION OF THE INVENTION

Titanium compounds are deposited on substrates, such as silicon containing substrates by known techniques for reaction of titanium containing precursors with ammonia under CVD conditions of elevated temperature and reduced pressure as set forth in U.S. Pat. No. 5,139,825, the entire text of which is expressly incorporated herein by reference.

The present invention is a process for enhancing the chemical vapor deposition of titanium containing compounds, such as titanium nitride, from a titanium containing precursor, such as tetrakis(dialkylamino)titanium, specifically those selected from the group consisting of tetrakis(dimethylamino)titanium, tetrakis(diethylamino) titanium and mixtures thereof, reacted with ammonia to produce the titanium containing compound on a semiconductor substrate by the addition of organic amines, such as dipropylamine, in a range of approximately 10 parts per million by weight to 10% by weight, preferably 50 parts per million by weight to 1.0 percent by weight, most preferably 100 parts per million by weight to 5000 parts per million by weight to the titanium containing precursor under chemical vapor deposition (CVD) conditions of 100 to 400° C., preferably 150 to 300° C., most preferably 200 to 250° C., under reduced pressure and using an inert carrier gas, such as nitrogen or helium, to deposit titanium nitride on a heated substrate, such as a heated silicon containing substrate.

A method to predict the performance of the titanium nitride chemical vapor deposition titanium containing precursors, such as tetrakis(dialkylamino)titanium, preferably tetrakis(dimethylamine)titanium (TDMAT) and tetrakis (diethylamino)titanium (TDEAT) has been developed. A precursor sample is hydrolyzed using water and then extracted using either a classical solvent extraction or solid-phase microextraction. The extract is analyzed by gas chromatography and the amount and nature of extracted compounds can be used to predict the deposition performance of the chemical.

TDMAT and TDEAT can be hydrolyzed either directly into water or by introducing onto ice and allowing the ice to thaw. The chosen approach depends on the sample quantity to be hydrolyzed. Quantities below 0.1 g are typically hydrolyzed directly into water while larger quantities (0.1 to 5 g) use the ice variation to address safety concerns and limit loss of volatile compounds owing to the exothermic hydrolysis reaction.

A typical procedure over ice consists of adding 10 g of water to a sealable vessel (vial or centrifuge tube), freezing the water, and then adding the desired quantity of TDMAT or TDEAT. The vessel is sealed to avoid loss of volatile compounds and the ice is allowed to thaw by leaving the vessel at room temperature. As the ice thaws, the liquid water initiates hydrolysis of the TDMAT or TDEAT in a controlled manner.

Extraction is affected in two modes. Solid-phase microextraction (SPME) is a solventless technique used in an increasing variety of analyses. The chosen fiber type depends on the compound types of interest. The general analyses described here have used a 100 μm non-bonded polydimethylsiloxane coated fiber. Other types of fibers can be substituted to enhance the extraction for specific classes of compounds. For example, a 65 μm polydimethylsiloxane/ divinylbenzene fiber has been used to provide better extraction efficiency for the nitrogen-containing compounds found in TDMAT and TDEAT.

The exact SPME conditions are subject to optimization. Typically analyses have used a 2 to 4 minute absorption in the headspace of the vial in which TDMAT or TDEAT has been hydrolyzed, followed by a 1 minute desorption in the injection port of a gas chromatograph. This serves to extract a majority of volatiles from the sample vial and desorb them into the gas chromatograph for characterization. Longer or shorter times may be used to optimize the extraction for specific compounds or reduce the analysis time.

The classical solvent-based extraction can use any water immiscible solvent which has an affinity for the extractable compounds. Diethylether, methylisobutylketone, toluene, and methylene chloride have all been found to be suitable extractants. Of these, methylene chloride is most frequently used since it has a low boiling point, is more dense than water, and does not have impurities similar to those found in TDMAT and TDEAT. The ratio of water to extraction solvent can be varied to adjust the extract concentration to a level suitable for the gas chromatographic detector.

The extract (either SPME or solvent) are analyzed by gas chromatography. The column type chosen depends on the degree of separation desired. The following 10 columns and gas chromatographic parameters have been-successfully used to separate TDMAT and TDEAT extractables.

TABLE 1

| Analysis Conditions 1: | |
|---|---|
| Column Phase | 100% polydimethylsiloxane |
| Phase Thickness (μm) | 5 |
| Column Length (m) | 30 |
| Column diamater (mm) | 0.53 |
| Flow rate (ml/min) | 8.0 |
| Injection Port Temperature (° C.) | 190 |
| Inject Volume (μL) | 5, Splitless |
| Initial Oven Temperature (° C.) & Time (min) | 50° C./5 minutes |
| Oven Ramp Rate | 10° C./minute |
| Final Oven Temperature and time | 250° C./5 minutes |
| Detector | Thermal Conductivity |
| Detector Temperature | 260° C. |

TABLE 2

Analysis Conditions 2:

| | |
|---|---|
| Column Phase | 100% polydimethylsiloxane |
| Phase Thickness ($\mu$m) | 5 |
| Column Length (m) | 30 |
| Column diamater (mm) | 0.53 |
| Flow rate (ml/min) | 8.0 |
| Injection Port Temperature (° C.) | 190 |
| Inject Volume ($\mu$L) | 1.0 |
| Initial Oven Temperature (° C.) & Time (min) | 50° C./5 minutes |
| Oven Ramp Rate | 20° C./minute |
| Final Oven Temperature and time | 250° C./5 minutes |
| Detector | Thermal Conductivity |
| Detector Temperature | 260° C. |

TABLE 3

Analysis Conditions 3:

| | |
|---|---|
| Column Phase | 95% polydimethylsiloxane/ 5% Divinylbenzene |
| Phase Thickness ($\mu$m) | 0.5 |
| Column Length (m) | 60 |
| Column diamater (mm) | 0.25 |
| Flow rate (cm/sec) | 50 |
| Injection Port Temperature (° C.) | 190 |
| Inject Volume ($\mu$L) | 0.2, 1:100 Split |
| Initial Oven Temperature (° C.) & Time (min) | 100° C./5 minutes |
| Oven Ramp Rate | 10° C./minute |
| Final Oven Temperature and time | 250° C./5 minutes |
| Detector | Mass Spectrometer (Finnegan GCQ) |
| Detector Temperature | 260° C. |

Mass spectrometry has been used to characterize the compounds found in TDMAT and TDEAT. Chromatograms obtained with a gas chromatography with mass spectrometer have been correlated to gas chromatography thermal conductivity detection to allow rapid classification of the extracted compounds. Additional detectors used for gas chromatography may be substituted for those indicated in the above tables to provide more specific analyses. Flame ionization detector, nitrogen-phosphorus detectors, photo-ionization detectors, electron-capture detectors, and atomic emission detectors can be used to focus in on specific types of compounds and/or enhance the sensitivity.

Calibration for the extracted compounds can be carried out by different approaches. The calibration can be performed using the method of standard addition and also using external standards for the solid-phase microextraction variation of this analysis. It has been found the choice between external calibration and the method of standard additions depends on the type of compound being quantitated. Aliphatic hydrocarbons appear to be fully extracted using both approaches and can be calibrated using external standards. The nitrogen-containing species, are not fully extracted owing to affinity for the aqueous phase and would required standard addition or matrix-matched calibration for accurate quantitation.

The results from the analyses described above are used to predict the deposition performance of the precursors. The compounds found in TDEAT and TDMAT may be identified using the mass spectrometric variation of the analysis described above. Typically, samples are found to contain unsaturated amines and also aliphatic hydrocarbons, presumably derived from synthesis techniques.

Gas chromatographic retention times for different column systems can be determined, preliminary compound identification, i.e., the class to which each compound is assigned, and thermal conductivity detector response for extracted TDEAT can be tabulated.

Figure 1:
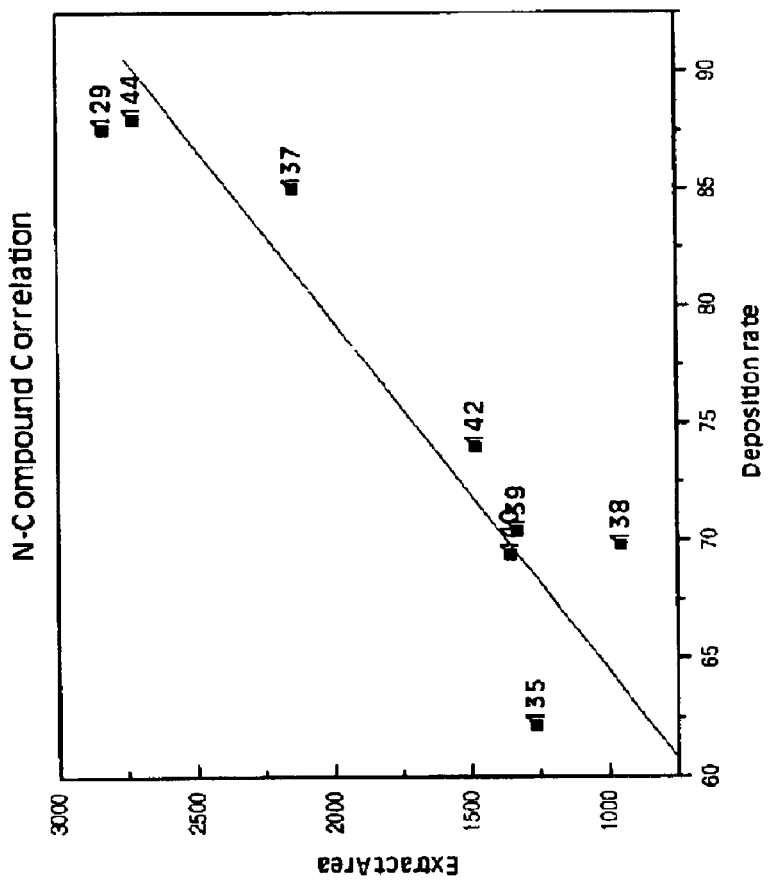
FIG. 1 is a graph of the correlation of compounds classified as n-containing with deposition rate (angstroms per minute). Linear Regression: Slope=67.2, Intercept=−3334, correlation coefficient, r=0.924.
Figure 2:
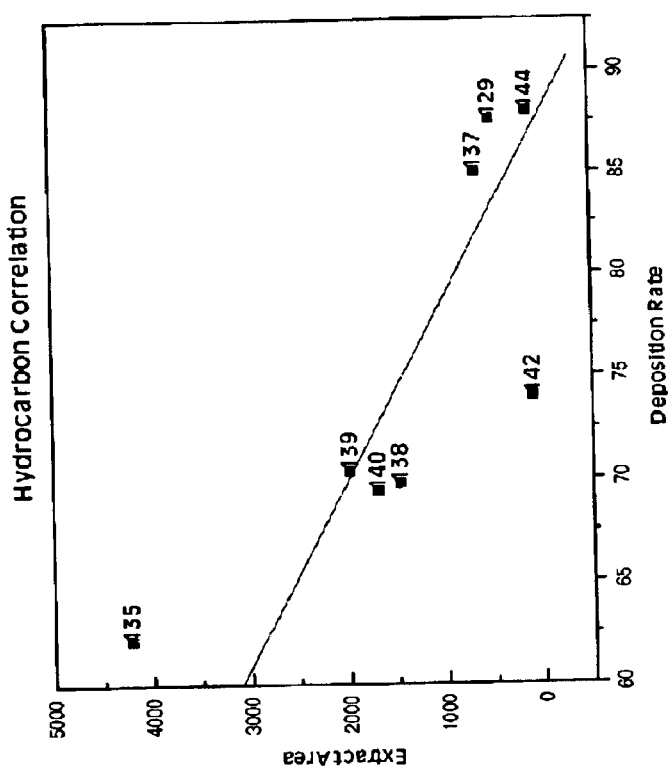
FIG. 2 is a graph of the correlation of compounds classified as hydrocarbons with deposition rate (angstroms per minute). Linear Regression: Slope=−111, Intercept=9774, correlation coefficient, r=−0.797.

The utility of this approach to predict deposition performance is demonstrated by Table 4 and FIGS. 1 and 2. The compounds found through analysis have been grouped into two main classifications, those which contain a nitrogen heteroatom (N), those which do not (HC), and those for which could not be definitely assigned to one group or the other (Unclass.).

TABLE 4

Results from extract analysis (arbitrary units) along with measured deposition rate. (angstroms/minute)

| Lot # | Total | N | HC | Unclass. | Deposition Rate |
|---|---|---|---|---|---|
| 129 | 3471 | 2829 | 511 | 131 | 1.41 |
| 135 | 5568 | 1265 | 4219 | 84 | 1.0 |
| 137 | 2965 | 2143 | 669 | 153 | 1.37 |
| 138 | 2948 | 954 | 1464 | 530 | 1.12 |
| 139 | 3889 | 1331 | 1978 | 580 | 1.13 |
| 140 | 3467 | 1355 | 1694 | 418 | 1.12 |
| 142 | 1641 | 1481 | 98 | 62 | 1.19 |
| 144 | 2901 | 2720 | 123 | 58 | 1.42 |

FIGS. 1 and 2 demonstrate a correlation between these two compound classes and the deposition rate performance of the chemical. Individual compounds found within these two main groupings may have a more specific effect on the deposition performance. The procedure described above is capable of measuring these compounds specifically and thereby predicting the deposition performance of TDMAT and TDEAT.

An analytical method capable of detecting hydrocarbon impurities in tetrakis(dimethylamine)titanium (TDMAT) has been developed in the present invention. The method is capable of detecting microgram quantities of hydrocarbon resulting in detection limits in the parts-per-million range. Owing to the number of species detected, individual compound calibration was impractical. The total hydrocarbon content is reported as n-decane and is semi-quantitative due to the assumption that all hydrocarbons have the same sensitivity as n-decane. Method validity was demonstrated by spiking a TDMAT sample with 6800 and 3580 parts per million (ppm) by weight of n-decane. Recovery was 106 and 120% by weight, respectively.

Assay, or the determination of molecular impurities, of tetrakis(dimethylamine)titanium (TDMAT) is difficult since this compound has a very low volatility and cannot be analyzed using gas chromatography. A variety of stationary phases and temperature profiles have been unsuccessful at providing repeatable results indicating the overall purity of TDMAT samples. The air and moisture reactivity prevent analysis using reversed phase liquid chromatography, a common technique for non-volatile or thermally labile compounds. Normal phase liquid chromatography was unsuccessful at providing an assay, presumably the result of reaction of the TDMAT with polar sites on the column packings and residual moisture in the mobile phase.

The current practice evaluating the TDMAT assay consists of obtaining a proton nuclear magnetic resonance spectrum (NMR) and examining the spectrum for any small -peaks not assignable to TDMAT. The current procedure is qualitative in nature since the sample preparation has not been controlled, nor is there any form of standardization or calibration. Since NMR is capable of detecting impurities at approximately the 1% level, the presence of any signal resolved from the TDMAT signal indicated an assay of <99%. Conversely, the absence of peaks indicated an assay of >99% (all percents by weight).

The reactivity of TDMAT with moisture was utilized to develop a method to determine trace hydrocarbons present in TDMAT. Rather than avoiding decomposition, the entire sample is completely hydrolyzed. After hydrolysis, the sample can be extracted to separate hydrocarbons not hydrolyzed from titanium dioxide and water-soluble impurities, such as dimethylamine. These hydrocarbons are surmised to originate from the solvents used to synthesize TDMAT since they are not by-products of the synthesis reaction. Extraction was accomplished using solid-phase microextraction. This technique uses a glass fiber coated with polymethyldisiloxane to absorb species with a high affinity for the coating. Polar compounds (water, dimethylamine) have a low affinity for the coating and are absorbed to a lesser extent. In this manner a hydrolyzed sample can be extracted quickly and in repeatable fashion with limited use of solvents.

The absorbed species are desorbed in the hot injection port of a gas chromatograph (GC) and are analyzed in normal gas chromatographic fashion using a suitable detector. Relatively little water and dimethylamine are transferred to the GC insuring good detectability for the hydrocarbon impurities.

Figure 3:
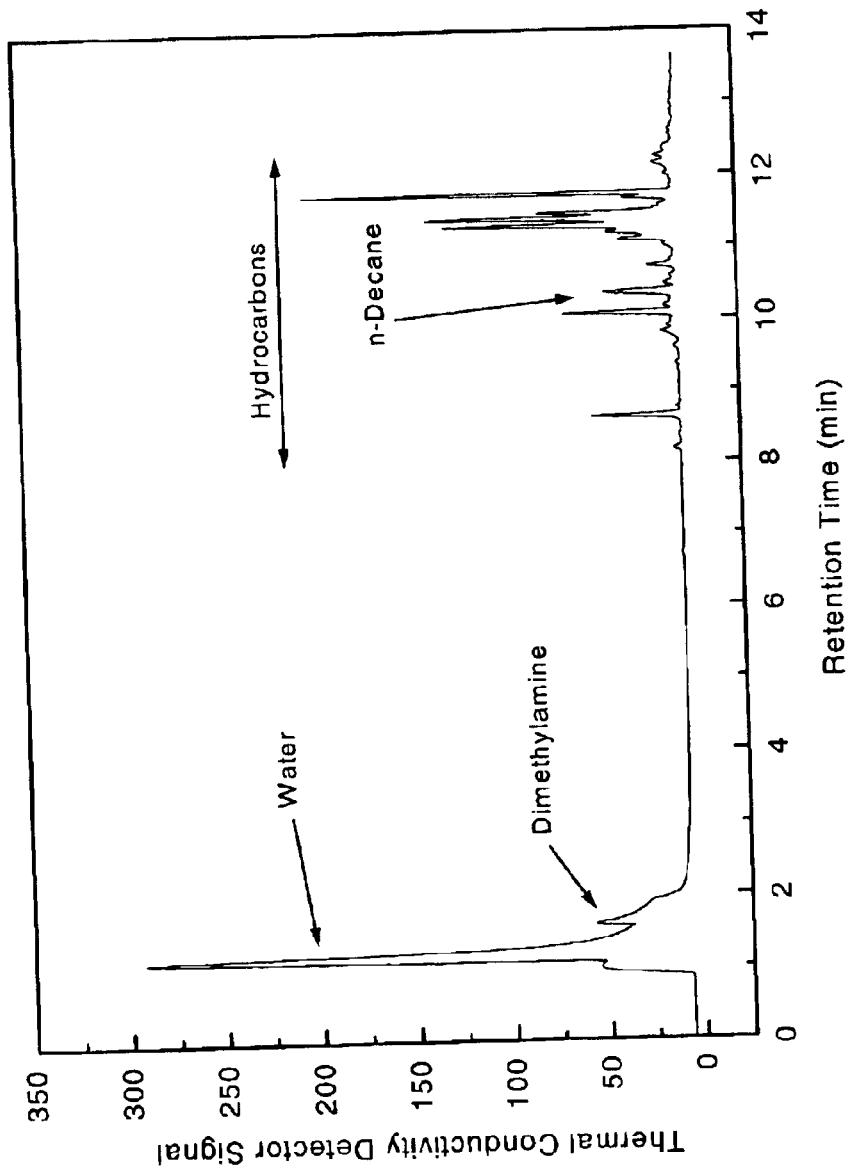
FIG. 3 is a graph of the typical chromatogram of the SPME-sampled headspace of a hydrolyzed TMDAT sample.

Solid-phase microextraction (SPME) was performed using SPME equipment available from Supelco Inc. (Bellefonte, Pa.). The type of fiber used was a 100 $\mu$m non-bonded polymethyidisiloxane (PDMS) coated fiber with manual sample introduction. A weighed aliquot of TDMAT (0.010 to 0.100 g) is injected via syringe into a 5 mL volume of distilled deionized water in a closed 15 mL vial resulting in immediate hydrolysis. Volatile species are retained since the vial contains a septum and cap. Following a period of at least 10 minutes to allow the sample to equilibrate with the ambient temperature, the vial headspace is sampled using the SPME fiber for 2.0 minutes. The fiber is transferred to the GC injection port and compounds are desorbed for 1.0 minute at a temperature of 190° C. A typical chromatogram is provided in FIG. 3 along with the GC conditions.

At approximately 1 minute, a broad double-humped peak elutes, the result of air leakage into the GC during SPME fiber introduction. The width of this peak is dependent on the time the SPME fiber is kept in the injection port of the GC. Superimposed on this peak is a large peak due to water adsorbed by the fiber, and a smaller peak which is due to dimethylamine produced by the hydrolysis of TDMAT. No other high volatility components are detected. After approximately 8 minutes retention time, a series of peaks from the hydrocarbon impurities begin. The n-decane peak was identified by GC-mass spectrometry and by spiking a sample with n-decane.

The GC response for the hydrocarbons is dependent on two primary factors, the sensitivity of the detector for each compound and the affinity of the fiber coating for each compound. To calibrate accurately, the identity of each compound must be determined and both these factors determined. Initial experiments utilized GC-mass spectrometry to identify the impurities extracted from the TDMAT. Mass spectral library searches indicated that most compounds were $C_9$ to $C_{20}$ alkanes and some aromatic species such as alkylbenzenes. The total number of impurities found was greater than 30. Owing to the spectral similarity of many alkanes, definite identification of all the impurities was not possible. The decision was made to proceed with a semi-quantitative approach, using a single compound to estimate the concentration for all the impurities. N-decane was chosen as its volatility (indicated by GC retention time) was median for the range of hydrocarbons detected. Its affinity for the fiber is therefore expected to be typical of all the hydrocarbons. The detector used was thermal conductivity detector (TCD) which provides approximately uniform response for these compounds. All results are for total hydrocarbons, reported as parts-per-million n-decane (ppm). Calculations were performed using the total hydrocarbon peak area, obtained by integrating all peaks between 7 and 14 minutes. No peaks eluted after 14 minutes.

Calibration is performed by preparing a standard of n-decane in isopropanol. Weighed portions of the isopropanol solution are added to 5 mL of distilled water in 15 mL vials and sample in the same manner as hydrolyzed TDMAT to construct the calibration curve. Calibrations were also performed via standard addition to determine if the method sensitivity was affected by the presence of hydrolyzed TDMAT.

The SPME fiber has a limited capacity. This capacity was determined by analyzing standards of increasing concentration and by varying the TDMAT sample size. FIG. 4 and FIG. 5 show plots of peak area versus sample amount.

The linear range of FIG. 4 demonstrates that the fiber capacity is approximately 250 $\mu$g of decane. TDMAT samples producing total peak area results above 12000 would require a smaller sample size since the response of the fiber/detector combination is non-linear when the fiber is overloaded. The maximum sample size is governed by the hydrocarbon concentration of the sample. For hydrocarbon concentrations below 1% by weight, the maximum TDMAT sample size is approximately the fiber capacity divided by the hydrocarbon concentration. (250 $\mu$g/0.01=25,000 $\mu$g TDMAT or 25 $\mu$L). FIG. 5 evaluates sample size by evaluating linearity as the sample size is increased. Sample volumes up to 25 $\mu$L produced a linear response indicating that the fiber capacity had not been exceeded. Both the n-decane calibration experiment and the TDMAT sample size indicate approximately the same fiber capacity assuming the total hydrocarbon impurity is approximately 1% by weight.

The presence of a matrix effect was evaluated by preparing a calibration curve in an aqueous matrix and one containing hydrolyzed TDMAT and comparing the slope or sensitivity. See Table 5 below.

TABLE 5

| μg Decane Added | Area (aqueous matrix) | Area (TDMAT matrix) |
|---|---|---|
| 0.0 | 0 | 2940, 3631 |
| 11.0 | 526.8 | 3881, 4002 |
| 22.5 | 823.3, 905.5, 1087 | 3681, 4204 |
| 45.0 | 1627, 1673 | 5032, 5032 |

Calibration data for hydrocarbons (expressed as decane) in aqueous and TDMAT matrices.
Aqueous slope = 35.4, Aqueous standard error of slope = 2.6, TDMAT slope = 36.5, TDMAT standard error of slope = 6.5.

The 95% confidence intervals of the slopes overlap, indicating that the presence of hydrolyzed TMDAT does not significantly affect slope sensitivity. To simplify analysis, future calibration was performed only in an aqueous matrix. Calibration should be performed at regular intervals or whenever the SPME fiber is changed since the sensitivity is primarily dependent on the fiber affinity for the hydrocarbons and will change over time or among fibers.

The calibration data reveal that precision can be poor, particularly in the TDMAT matrix. Precision was evaluated both for replicate analyses and over different days. Replicate analyses had a relative standard deviation of between 5 and 15%. Precision was not different with aqueous or TDMAT-matrix samples and some unknown/uncontrolled factor appears to be responsible for the high variances measured. A contributing factor to the poor precision is the small sample size. The high affinity of the fiber for the hydrocarbons and the relatively high hydrocarbon concentration in TDMAT requires a small sample size. Control of the fiber adsorption and desorption time interval improved the precision. Owing to the poor precision for some analyses, it is recommended that a minimum of three sample preparations and analyses be performed on each sample. It is not possible to re-analyze (absorb and introduce into a GC) a hydrolyzed sample due to depletion of the hydrocarbons in the headspace by the extraction procedure.

Analysis reproducibility was evaluated by analyzing 2 samples on different days. Table 6 provides these results.

TABLE 6

| Sample | Result-Day 1 | Result-Day 2 |
|---|---|---|
| Lot A | 6224 (sa) | 6131 ± 195 (d) |
| Lot B | 16,222 ± 826 (d) | 16019 ± 1053 (t) |

Analysis reproducibility study.
Average ± 1 standard deviation.
(sa)-result obtained by 4 level standard addition,
(d)-duplicate analyses, aqueous calibration,
(t)-triplicate analyses, aqueous calibration.

No precision estimate is available for Lot A, Day 1, since only 1 unspiked sample was analyzed. There is no significant difference (95% confidence) between results obtained on different days. The Lot B, Day 2 result had a high standard deviation due to one apparent outlier (individuals were 16327, 16885, and 14846). However, the low point could not be discarded using any outlier test since a good estimate of the method variance is not available. Arbitrary removal of the low point improves the precision to 16606±395. This result is not significantly different than the day 1 analysis.

Potential loss of hydrocarbon during the hydrolysis step, which is exothermic, was evaluated by spiking decane directly into a TDMAT sample and performing the entire analysis procedure. Two different amounts of decane were added to two aliquots of a TDMAT sample. Results are summarized in Table 7.

TABLE 7

| Unspiked Result (ppm) | Spiked Result (ppm) | Spike Concentration (ppm) | Difference (Spiked-Unspiked) (ppm) | Percent Recovery |
|---|---|---|---|---|
| 8988 | 16238 | 6801 | 7250 | 106.6 |
| 8988 | 13300 | 3582 | 4312 | 120.4 |

Spike and recovery study results for n-decane spiked into TDMAT.
All samples were analyzed in duplicate and the average hydrocarbon content (in ppm n-decane) is listed.

The recovery of n-decane added to TDMAT was satisfactory. The initial unspiked sample was analyzed 1 day prior to the spike samples indicating good day-to-day reproducibility.

An analytical method, capable of detecting hydrocarbon impurities in TDMAT has been developed in accordance with the present invention. The analytical procedure described is semi-quantitative since only a single compound, n-decane, is used for calibration. Although the current precision has a relative standard deviation of 5–15%, the method is able to detect hydrocarbon impurities and distinguish among different sources.

Current method limitations are the high relative precision and the semi-quantitative results. The method could be made quantitative in nature by identifying all the impurities and calibrating for each or developing relative response factors for each compound relative to n-decane. These relative response factors would need to take into account the affinity of each compound for the PDMS fiber.

Alternative analysis for hydrocarbon impurities and analysis of amines was studied using tetrakis(diethylamino) titanium. Tetrakis (diethylamino) titanium (TDEAT) is purified by short path distillation on a 6" wiped film still (Pope Scientific, Inc., Milwaukee, Wis.).

Short path distillation is a process whereby low volatility chemicals can be separated without extensive exposure to heat that would otherwise have the potential to decompose the chemical or its constituents. Chemical is introduced into a downflow heated tubular inner wall of a distillation still under vacuum conditions. Coaxially within the tubular heated wall is a condenser. Liquid chemical is drawn down the inner surface of the heated wall of the still and more volatile constituents are vaporized and condensed on the coaxially positioned condenser. Separate collection outlets remove the resulting condensate or distillate and the lower volatile liquid or residue at the base of the still.

The original process parameters did not reduce a variety of volatile impurities down to an acceptable concentration. These parameters, which include feed rate, rotor speed, vacuum, wall temperature, post-wall temperature, main condenser temperature, prefraction condenser temperature, and prefraction flask temperature, were optimized to reduce the volatile impurities to acceptable concentrations.

Purification of TDEAT has been performed by wiped film distillation by the inventors. The original parameters were determined by calculation, and once put into practice, they were found to yield acceptable results using the analytical techniques that were in use at that time. The only assay method in use was NMR. As the inventors further developed this product, the inventors devised a technique to analyze for volatile compounds such as hydrocarbons and amines. This new assay technique highlighted a need for improved purification abilities.

The original parameters included an evaporation (wall) temperature of 120° C. This temperature, at low pressures, is higher than needed for TDEAT evaporation. Hence, higher boiling volatiles will also evaporate off of the wall. The original condensation (finger) temperature was 10° C., and this was low enough not only to condense TDEAT, but to condense many other lower boiling volatiles. These absolute temperatures do not take into account the changes in vacuum within the distillation chamber, and the vacuum in the chamber is dependent on a variety of factors, including raw material composition and feed rate.

Two approaches were taken to address this problem. The first is based on a change from absolute temperatures to relative temperatures. In light of the inherent problem in controlling vacuum, the difference in temperature between the wall and the finger becomes more important than the absolute temperature of the wall or the finger. Contact time between the wall and the liquid, a function of rotor speed, was also addressed. This allows raw material with a variety of compositions to be run in this system.

The second approach was a focus on a more robust system. More precise temperature control was required to implement the first approach. This included improved measuring of the liquid on the wall, as well as a temperature measurement of the liquid as it left the heated portion of the wall. It also required improved finger temperature measurement. The temperature of the prefraction flask was lowered to insure the lower boiling volatiles did not evaporate again after they were collected.

Six experiments were done to examine the effects of parameter changes on purity.

EXPERIMENT #1

This experiment was a graduated increase in the finger temperature from 10° C. to 70° C. With all other parameters held constant, the finger was set at 10° C., 30° C., 50° C., and 70° C. Two liters of raw material was processed at each setting for a total raw material usage of eight liters. A sample was taken at each finger temperature, and the volume of prefraction at each temperature was recorded. The samples were analyzed for hydrocarbon (HC) profile.

This Table 8 compares the HC levels in ppm at various finger temperatures in Experiment #1. The numbers are high because almost all of the prefraction is HC. The volume collected increases as the temperature increases, showing that the lower boiling HC's do not condense on the finger. The HC for this lot was 2630.

TABLE 8

| Temp (° C.) | QASS # | HC | PF vol. (ml) | Main (L) | Heels (L) |
|---|---|---|---|---|---|
| Raw (8 L) | 1036 | 5559 | N/A | N/A | N/A |
| 10 | 1037 | 50715 | 5 | 1.8 | .2 |
| 30 | 1038 | 52626 | 5 | 2.0 | .4 |
| 50 | 1039 | 55101 | 10 | 1.8 | .3 |
| 70 | 1040 | 47342 | 15 | 1.2 | .6 |
| Vol. Totals | N/A | N/A | 35 ml | 6.8 | 1.3 |

EXPERIMENT #2

This experiment was an optimization of the run by setting relative temperatures for the wall and finger. With the finger temperature constant at 70° C., the wall temperature was increased until the main fraction was seen flowing into the receiver. With the wall temperature held at that temperature, the finger temperature was increased until flow into the main receiver stopped. The finger temperature was then lowered until flow resumed.

Table 9 shows the relationship between the wall and finger temperatures in Experiment #2. Flow can be started or stopped by changing the evaporation (wall) temperature or the condensation (finger) temperature. These temperatures are only applicable to this run. The evaporation temperature was increased first, until at 90° C., product flowed. It continued to flow until the condensation temperature increased to 85° C., when it stopped. It restarted as the temperature was lowered to 84° C. The HC for this lot was 1772 ppm.

TABLE 9

| Wall (temp) | 70 | 75 | 80 | 85 | 90 | 90 | 90 | 90 | 90 |
|---|---|---|---|---|---|---|---|---|---|
| Finger (temp) | 70 | 70 | 70 | 70 | 70 | 75 | 80 | 85 | 84 |
| flow into rec'r | no | no | no | no | yes | yes | yes | no | yes |

EXPERIMENT #3

This experiment examined the effect of rotor speed and feed rate on purity. Another thermocouple was added to the middle exterior of the wall to better approximate the exact temperature of the liquid on the interior wall. Another thermocouple was added at the bottom exterior of the wall to approximate the temperature of the liquid as it exited the heated area. With all other parameters held constant, the rotor speed was varied from 200 RPM to 350 RPM to estimate the retention time of liquid on the wall. Liquid was introduced into the chamber at a fixed rate, and the length of time to reach the bottom of the chamber was estimated. The rotor speed was then held constant and the feed rate was varied to observe the effect of flooding the wall with liquid and under-supplying the wall with liquid. Optimums for feed rate, rotor speed, and all temperatures were considered reached when the bottom wall temperature was 5° C. less than the finger temperature.

Table 10 compares the relative (delta) temperature between the evaporation temperature (bottom) of the liquid exiting the chamber and the condensation temperature (finger) for Experiment #3. The bottom-temperature is a function of rotor speed, feed rate, and wall temperature.

TABLE 10

| Time (hr) | 1 | 2 | 3 | 4 | 5 | 6 | 7 | 8 | 9 |
|---|---|---|---|---|---|---|---|---|---|
| Finger | 80 | 84 | 83 | 84 | 85 | 83 | 83 | 84 | 84 |
| Bottom | 98 | 82 | 72 | 72 | 62 | 66 | 69 | 80 | 70 |
| Delta | 18 | 2 | 11 | 12 | 23 | 17 | 14 | 4 | 14 |

EXPERIMENT #4

This experiment examined the effect of distilling material with a low hydrocarbon impurity level. Lot #141 was redistilled at the parameters of Lot #142 in Table 13, below, using the newly determined optimization techniques.

Table 11 is a comparison of the process parameters for lot #141 and lot #143. The values are typical, but did vary.

TABLE 11

|  | finger (temp) | wall (temp) | speed (RPM) | vacuum (mTorr) | rate (Lt./hr) | HC (ppm) |
|---|---|---|---|---|---|---|
| Lot 141 | 70 | 120 | 202 | 500 | 2.2 | 2630 |
| Lot 143 | 84 | 83 | 275 | 500 | 2.2 | 33 |

EXPERIMENT #5

This experiment examined the effect of packing the prefraction flask in dry ice to prevent any captured volatiles from evaporating again. The raw material was vendor lot material, which has seen typical HC levels of 5000 ppm.

EXPERIMENT #6

This experiment examined the ability of the optimized process parameters to purify rework material and customer returns. This type of raw material is normally in the 3000 ppm range.

Table 12 records the parameters for these lots. The values are typical, but did vary.

TABLE 12

|  | finger (temp) | wall middle | wall bottom | wall setpoint | speed (RPM) | vacuum (mTorr) | rate (Lt./hr) | HC (ppm) |
|---|---|---|---|---|---|---|---|---|
| Lot 144 | 84 | 87 | 80 | 100 | 275 | 800 | 0.6 | 70 |
| Lot 145 | 84 | 86 | 72 | 96 | 275 | 1000 | 0.7 | 242 |

Table 13 is a summary of the test lots. The ranges given are highs and lows without any attention to average values

TABLE 13

| Lot | HC | finger temp | wall setpoint | wall middle | wall bottom | vacuum (mTorr) | rate Lt./hr | speed RPM | yield % |
|---|---|---|---|---|---|---|---|---|---|
| 141 | 2630 | 10–70 | 120 | — | — | 240–950 | 2.2 | 202 | 75 |
| 142 | 1772 | 78–84 | 70–95 | — | — | 425–700 | 1.0 | 350 | 77 |
| 143 | 33 | 80–85 | 100 | 80–91 | 66–82 | 450–600 | .85 | 200–350 | 71 |
| 144 | 70 | 82–84 | 100 | 83–91 | 70–84 | 800–1200 | .6 | 275 | 74 |
| 145 | 242 | 84 | 59–96 | 85–87 | 68–72 | 500–1100 | .7 | 275 | 66 |

Hydrocarbon impurities can be effectively removed by using appropriate process parameters. Because the vacuum inside of the wiped film chamber is dependent on a number of factors including raw material impurity concentrations, feed rate, wall temperature, vacuum pump condition, liquid nitrogen trap temperature, and prefraction condenser trap temperature, absolute temperatures do not do a good job of optimizing the equipment capabilities. Relative temperatures are better suited to removing volatile impurities. The relative separation between the evaporation temperature and the condensation temperature is the best indicator of a proper short path distillation. The absolute temperature around which these two temperatures lie can vary according to the vacuum inside of the chamber, but the relative temperatures between them should remain constant.

Condensation temperature is a reasonably simple measurement, but measurement at the finger point of entry and exit is recommended in addition to a bath measurement. A true measurement of the liquid wiped on the wall is a bit more difficult. The simplest way to do this is to attach a thermocouple to the unheated wall directly below the heated wall. The liquid that has not evaporated flows down the wall at this point, and it should be just above the condensation temperature. If it is below that temperature, the distillation is inefficient because some of the TDEAT is not being evaporated. If it is much above the condensation temperature, impurities that should remain liquid will have also evaporated, thus decreasing the purity of the main fraction.

It is also important to insure that there is enough contact time between the wall and the liquid to effect evaporation efficiently. There is also the danger that if the wall temperature is too high, "hotspot" decomposition of the liquid could occur even if the exiting temperature is normal. There is also the possibility of a flow rate low enough that all of the liquid evaporates, including some high boiling impurities, before reaching the bottom of the chamber. This is done by matching the middle column temperature to the bottom temperature. This ensures that the liquid has reached an evaporation temperature halfway through the retention time, that no additional heating is occurring in the remaining retention time, and that the flow rate is high enough to preclude evaporation to dryness before reaching the chamber bottom.

There is a slight decrease in yield, about 10% by weight, due to an increase in the heels and prefraction. However, this technique allows rework of the heels and prefraction to extract the remaining TDEAT, and this offsets some of the loss in yield. This technique looks promising for optimizing any chemical purified by short path distillation.

EXAMPLE #7

It was suggested that absorption would be a useful technique for reducing HC impurities. Samples were prepared that contained approximately 1:1 ratio by weight of TDEAT with an absorbent. Lot #140 was chosen as the source for the TDEAT for this experiment, and titanium oxide, activated carbon, and Puraspec 2221 (ICI) were chosen as the absorbents. These samples were agitated daily by hand, and sampled for HC content after one week. There was no identifiable change in the TiO2 sample. Most of the color in the carbon sample was removed, as was some of the HC. In the Puraspec sample, the HC was lowered to 315 ppm, and some of the color was removed. Several repeat SPME tests for HC were run on the Puraspec sample, and values of 133 and 159 ppm HC were detected.

TABLE 14

| Sample # | 140VT | Q2006-A | Q2006-B | Q2006-C | Q2006-D |
|---|---|---|---|---|---|
| Item | Lot 140VT | control | TiO2 | carbon | Puraspec |
| HC | 4800 | 4403 | 4818 | 2646 | 315 |

EXPERIMENT #8

Experiment #7 was repeated to verify the results, but the ratio of absorbent to TDEAT was decreased to a 1:2 ratio by weight An extra sample of a 50/50 blend of carbon and Puraspec 2221 was included to determine if both color and HC could be improved in one step. Also, an intermediate sample (Q2013D) was removed from the Puraspec 2221 vial after two days to check the removal efficiency of the absorbent, as well as a control sample (Q2013A-1) at the same time. The Puraspec lowered the HC level from 5475 ppm to 2793 ppm in 24 hours. The vials were sampled again after one week, and the results are tabulated below. The same trends were noted, although the decrease in absorbent showed a decrease in HC removal. The blend was successful in removing both color and HC, but neither was removed at the efficiency of each pure adsorbent alone. Again, the carbon was noted as removing the most color, and the Puraspec 2221 was noted as removing the most HC.

EXPERIMENT #9

An experiment for testing the scale-up possibilities of Puraspec 2221 was done. In a glovebox, a flask was charged with 2009 grams of TDEAT and 204 grams of Puraspec 2221. This is 10% by weight and an approximate 4 to 1 ratio by volume of TDEAT to absorbent. The sealed flask was stirred with a stirbar apparatus for one week. It was sampled at two days, four days, and one week. The sample at one week was taken after the absorbent was filtered out. The filtration was done through a 10 micron filter (Arbortech, Model# Polycap HD), and finally through a 0.2 micron filter (Balston, Model# AAQ). The process yielded approximately 2 kg.

TABLE 16

| Sample # | Q2030-A | Q2030-B | Q2033-A | Q2033 | Q2046 |
|---|---|---|---|---|---|
| item | 2 day control | 2 day absorbed | 4 day control | 4 day absorbed | final |
| HC | 2988 | 1552 | 1932 | 678 | 441 |

It appears that absorption is a viable method for removing HC from TDEAT. It also shows promise as a method for removing some of the color impurities. Additional techniques for this process have been considered. These include pressure filtration, high/low temperature filtration, sequential filtration, banded chromatography, and recirculated filter beds.

EXPERIMENT #10

An experiment was done to observe the effects of a series of flask to flask (one plate) distillations. A 5 liter flask was filled with TDEAT (Lot 140) and distilled under dynamic vacuum. A prefraction of 10% by weight was taken and a heel of 10% by weight was left. The main fraction was sampled, and the process was repeated for a total of three distillations. This method appears to be another way to remove the HC content in TDEAT. This experiment indicates that each distillation reduces HC to approximately one fourth of the starting HC.

TABLE 17

| Sample # | 140VT | Q2010VT | Q2032VT | Q2041VT |
|---|---|---|---|---|
| item | lot material | 1X | 2X | 3X |
| HC | 4800 | 1677 | 469 | 92 |

EXPERIMENT #11

An Oldershaw distillation system was built to examine TDEAT behavior in this type of apparatus. The 5 liter reboiler was fitted with a 1" 5-plate Oldershaw column, and the system was placed under a dynamic vacuum of 500

TABLE 15

| Sample # | 140VT | Q2015-A | Q2015-B | Q2015-C | Q2015-D | Q2015-E |
|---|---|---|---|---|---|---|
| item | Lot 140VT | TiO2 | Blend | carbon | Puraspec | control |
| HC | 4800 | 4570 | 1036 | 4010 | 650 | 4937 | mTorr (+/−200 mTorr). Two runs were made in which a prefraction was taken and a main fraction was collected. The first run was a rework of Lot #135, and the second was a batch using material from a different source. The color in the main fractions was noted as much improved over the raw color. This technique is also a usable method for removing, hydrocarbons.

TABLE 18

| Sample # | Q1093VT | Q1097VT | Q2002VT | Q2014VT |
|---|---|---|---|---|
| item | run #1-raw | run #1-main | run #2-raw | run #2-main |
| HC | 9019 | 1107 | 3720 | 1780 |

Based upon the results discussed above, the inventors for the first time have been able to determine a methodology for predicting deposition rates for titanium containing precursors based upon analyzed amine and hydrocarbon contents for various batches or lots of commercially produced titanium containing precursors for end uses, such as the electronics fabrication industry, where yield and throughput are critical to the economics of integrated circuit manufacture.

Accordingly the present inventors have determined a process for determining a predicted deposition rate of a batch of a titanium containing precursor in a chemical vapor deposition of a titanium containing compound on a substrate, comprising; analyzing the organic amine content of the batch to determine an analytical amine content, comparing the analytical amine content against an amine content standard (which can be compiled from averaging a series of amine content analyses) and determining the predicted deposition rate from a deposition rate standard (which can be compiled from averaging a series of titanium compound depositions) based upon the deviation of the analytical amine content from the amine content standard, wherein the predicted deposition rate is greater than the deposition rate standard when the analytical amine content is greater than the amine content standard and the predicted deposition rate is less than the deposition rate standard when the analytical amine content is less than the amine content standard.

Similarly, the present inventors have determined a process for determining a predicted deposition rate of a batch of a titanium containing precursor in a chemical vapor deposition of a titanium containing compound on a substrate, comprising; analyzing the hydrocarbon content of the batch to determine an analytical hydrocarbon content, comparing the analytical hydrocarbon content against an hydrocarbon content standard (which can be compiled from averaging a series of hydrocarbon content analyses) and determining the predicted deposition rate from a deposition rate standard (which can be compiled from averaging a series of titanium compound depositions) based upon a deviation of the analytical hydrocarbon content from the hydrocarbon content standard, wherein the predicted deposition rate is less than the deposition rate standard when the analytical hydrocarbon content is greater than the hydrocarbon content standard and the predicted -deposition rate is -greater than the deposition rate standard when the analytical hydrocarbon content is less than the hydrocarbon content standard.

The present inventors have also determined a methodology for correlating the analyzed amine contents and the analyzed hydrocarbon contents for a batch of titanium containing precursor to determine a predicted deposition rate based upon the impact or influence of both amine and hydrocarbon contents in such batches.

The present invention provides techniques to ascertain amine and hydrocarbon content and/or impurities, respectively in titanium containing precursors for titanium compound deposition so as to enhance the deposition rate of the titanium compound. At the low ppm levels that effect enhancement of deposition rate (amine) or retard deposition rate (hydrocarbon), it is critical to have analytical techniques sensitive enough to detect such low levels of amine or hydrocarbon functionality. The detection of levels of amine or hydrocarbon or the specific doping or spiking of amine with controlled amounts of amine is important to be able to accurately and precisely predict the deposition rate of commercial lots of titanium containing precursor for customers using the titanium containing precursor to deposit titanium containing films, particularly in the electronics fabrication industry, which requires precise recipies and reproducible results to sustain mass production of high yields of acceptable integrated circuits and related electronic devices.

In addtion, the discovery of the impact of amine content and hydrocarbon impurities in titanium containing precursor deposition rates has led to the discovery of novel and unexpected processes for enhancing the process of deposition of titanium containing compounds, such as films, for integrated circuits and other electronic devices. It is not obvious that amine addition to titanium containing precursors would enhance the deposition rate of titanium compounds on a substrate because for many of the preferred commercially viable titanium-containing precursors, such as TDMAT and TDEAT, amine functionality is a byproduct of the decomposition of such precursors during CVD deposition of titanium nitride on semiconductor substrates from such precursors.

The present invention has been set forth with regard to several preferred embodiments, but the full scope of the present invention should be ascertained from the claims which follow.

What is claimed is:

1. A process for determining a predicted deposition rate of a batch of a titanium containing precursor in a chemical vapor deposition of a titanium containing compound on a substrate, comprising; analyzing the organic amine content of said batch to determine an analytical amine content, comparing said analytical amine content against an amine content standard and determining said predicted deposition rate from a deposition rate standard based upon the deviation of the analytical amine content from said amine content standard wherein said predicted deposition rate is greater than the deposition rate standard when said analytical amine content is greater than said amine content standard and said predicted deposition rate is less than said deposition rate standard when said analytical amine content is less than said amine content standard.

2. The process of claim 1 wherein said analyzing the organic amine content of said batch is an analysis selected from the group consisting of solid-phase microextraction and short path distillation on a wiped film still.

3. The process of claim 1 wherein said titanium containing precursor is selected from the group consisting of tetrakis(dimethylamino)titanium, tetrakis(diethylamino)titanium and mixtures thereof.

4. The process of claim 1 wherein said batch of a titanium containing precursor is analyzed for the hydrocarbon content of said batch to determine an analytical hydrocarbon content, comparing said analytical hydrocarbon content against an hydrocarbon content standard, determining a second predicted deposition rate from a hydrocarbon deposition rate standard based upon the deviation of the analytical hydrocarbon content from said hydrocarbon content standard and correlating said second predicted deposition rate with said predicted deposition rate to determine a third combined amine/hydrocarbon predicted deposition rate for said batch.

5. The process of claim 4 wherein said titanium containing compound is titanium nitride.

6. A process for determining a predicted deposition rate of a batch of a titanium containing precursor in a chemical vapor deposition of a titanium containing compound on a substrate, comprising; analyzing the hydrocarbon content of said batch to determine an analytical hydrocarbon content, comparing said analytical hydrocarbon content against an hydrocarbon content standard and determining said predicted deposition rate from a deposition rate standard based upon the deviation of the analytical hydrocarbon content from said hydrocarbon content standard.

7. The process of claim 6 wherein said predicted deposition rate is less than the deposition rate standard when said analytical hydrocarbon content is greater than said hydrocarbon content standard and said predicted deposition rate is greater than said deposition rate standard when said analytical hydrocarbon content is less than said hydrocarbon content standard.

8. The process of claim 6 wherein said analyzing the hydrocarbon content of said batch is an analysis selected from the group consisting of solid-phase microextraction and short path distillation on a wiped film still.

9. The process of claim 6 wherein said titanium containing precursor is selected from the group consisting of tetrakis(dimethylamino)titanium, tetrakis(diethylamino)titanium and mixtures thereof.

* * * * *